(12) United States Patent
Cho et al.

(10) Patent No.: US 11,101,221 B2
(45) Date of Patent: Aug. 24, 2021

(54) INPUT/OUTPUT PINS FOR CHIP-EMBEDDED SUBSTRATE

(71) Applicant: Infineon Technologies Americas Corp., El Segundo, CA (US)

(72) Inventors: Eung San Cho, Torrance, CA (US); Danny Clavette, Greene, RI (US)

(73) Assignee: Infineon Technologies Americas Corp., El Segundo, CA (US)

( * ) Notice: Subject to any disclaimer, the term of this patent is extended or adjusted under 35 U.S.C. 154(b) by 348 days.

(21) Appl. No.: 15/951,001

(22) Filed: Apr. 11, 2018

(65) Prior Publication Data

US 2018/0233453 A1    Aug. 16, 2018

Related U.S. Application Data

(62) Division of application No. 15/339,621, filed on Oct. 31, 2016, now Pat. No. 9,966,341.

(51) Int. Cl.
*H01L 23/538* (2006.01)
*H01L 23/00* (2006.01)
(Continued)

(52) U.S. Cl.
CPC ........ *H01L 23/5389* (2013.01); *H01L 21/486* (2013.01); *H01L 21/52* (2013.01);
(Continued)

(58) Field of Classification Search
CPC .... H01L 23/5389; H01L 21/486; H01L 21/52
See application file for complete search history.

(56) References Cited

U.S. PATENT DOCUMENTS

| 5,717,252 | A | 2/1998 | Nakashima et al. |
| 6,420,255 | B1 | 7/2002 | Takahashi |

(Continued)

FOREIGN PATENT DOCUMENTS

| CN | 103000619 A | 3/2013 |
| CN | 104160499 A | 11/2014 |

(Continued)

OTHER PUBLICATIONS

Office Action, in the Chinese language, from counterpart Chinese Application No. 201711044146.6, dated Jun. 1, 2020, 6 pp.

(Continued)

*Primary Examiner* — Errol V Fernandes
(74) *Attorney, Agent, or Firm* — Shumaker & Sieffert, P.A.

(57) ABSTRACT

Input/output pins for a chip-embedded substrate may be fabricated by applying a contact-distinct volume of solder to at least two contacts that are recessed within the chip-embedded substrate, temperature-cycling the chip-embedded substrate to induce solder reflow and define an input/output pin for each one of the at least two contacts, and machining the input/output pin for each one of the at least two contacts to extend exposed from the chip-embedded substrate to a common height within specification tolerance. Such a technique represents a paradigm shift in that the manufacturer of the chip-embedded substrate, as opposed to the immediate customer of the manufacturer, may assume the burden of quality control with respect to minimizing unintended solder void trapping under the input/output pins, thereby reinforcing existing customer loyalty and potentially attracting new customers.

20 Claims, 10 Drawing Sheets

(51) Int. Cl.
    *H01L 21/48*     (2006.01)
    *H01L 21/52*     (2006.01)
    *H01L 23/48*     (2006.01)
    *H01L 25/16*     (2006.01)
    *H01L 21/60*     (2006.01)

(52) U.S. Cl.
CPC ............ *H01L 23/481* (2013.01); *H01L 24/19* (2013.01); *H01L 24/24* (2013.01); *H01L 24/25* (2013.01); *H01L 25/16* (2013.01); *H01L 2021/6009* (2013.01); *H01L 2021/60135* (2013.01); *H01L 2224/04105* (2013.01); *H01L 2224/06181* (2013.01); *H01L 2224/12105* (2013.01); *H01L 2224/24137* (2013.01); *H01L 2224/2518* (2013.01); *H01L 2224/32225* (2013.01); *H01L 2224/73267* (2013.01); *H01L 2924/1033* (2013.01); *H01L 2924/10253* (2013.01); *H01L 2924/10272* (2013.01); *H01L 2924/13055* (2013.01); *H01L 2924/13064* (2013.01); *H01L 2924/13091* (2013.01)

(56) References Cited

U.S. PATENT DOCUMENTS

| | | | |
|---|---|---|---|
| 7,043,830 | B2 | 5/2006 | Farnworth |
| 7,410,824 | B2 | 8/2008 | Do et al. |
| 8,432,022 | B1 | 4/2013 | Huemoeller et al. |
| 9,728,481 | B2 | 8/2017 | Yee et al. |
| 2001/0008310 | A1 | 7/2001 | Sakuyama et al. |
| 2003/0114024 | A1 | 6/2003 | Miyagawa |
| 2003/0234442 | A1 | 12/2003 | Su et al. |
| 2004/0065946 | A1 | 4/2004 | Hung et al. |
| 2005/0093153 | A1 | 5/2005 | Liu |
| 2005/0121784 | A1 | 6/2005 | Standing |
| 2006/0014316 | A1 | 1/2006 | Lin et al. |
| 2007/0215997 | A1 | 9/2007 | Standing |
| 2008/0036085 | A1 | 2/2008 | Jo et al. |
| 2009/0212423 | A1 | 8/2009 | Tanaka et al. |
| 2010/0006994 | A1 | 1/2010 | Shim et al. |
| 2010/0052148 | A1 | 3/2010 | Hsu et al. |
| 2010/0090333 | A1 | 4/2010 | Hayashi |
| 2013/0119539 | A1 | 5/2013 | Hsiao et al. |
| 2013/0284499 | A1 | 10/2013 | Imafuji |
| 2013/0285242 | A1 | 10/2013 | Watts et al. |
| 2014/0091457 | A1 | 4/2014 | Jiang et al. |
| 2015/0008575 | A1 | 1/2015 | Liu et al. |
| 2015/0041994 | A1 | 2/2015 | Gerber |
| 2016/0174379 | A1* | 6/2016 | Shimizu ................ H05K 1/181 361/760 |
| 2019/0189564 | A1* | 6/2019 | Guzek ............... H01L 23/49816 |

FOREIGN PATENT DOCUMENTS

| | | |
|---|---|---|
| CN | 104538375 A | 4/2015 |
| EP | 1049162 A2 | 11/2000 |
| JP | 200312075 A | 11/2000 |

OTHER PUBLICATIONS

Office Action, in the German language, from counterpart German Application No. 102017219394.8, dated Apr. 10, 2019, 5 pp.

Nguty, et al., "Modeling a Low Cost Wafer Bumping Technique for Flip Chip Application," International Journal of Microcircuits and Electronic Packaging, vol. 22, No. 4, Fourth Quarter 1999, pp. 327-333.

Kloeser, et al., "Low cost bumping by stencil printing : process qualification for 200 μm pitch," Microelectronics Reliability, 40; Mar. 17, 2000; pp. 497-505.

U.S. Appl. No. 15/339,621, filed by Eung San Cho, filed Oct. 31, 2016.

Prosecution History from U.S. Appl. No. 15/339,621, dated from Oct. 2, 2017 through Jan. 9, 2018, 23 pp.

Office Action, in the Chinese language, from counterpart Chinese Application No. 201711044146.6, dated Mar. 19, 2021, 6 pp.

* cited by examiner

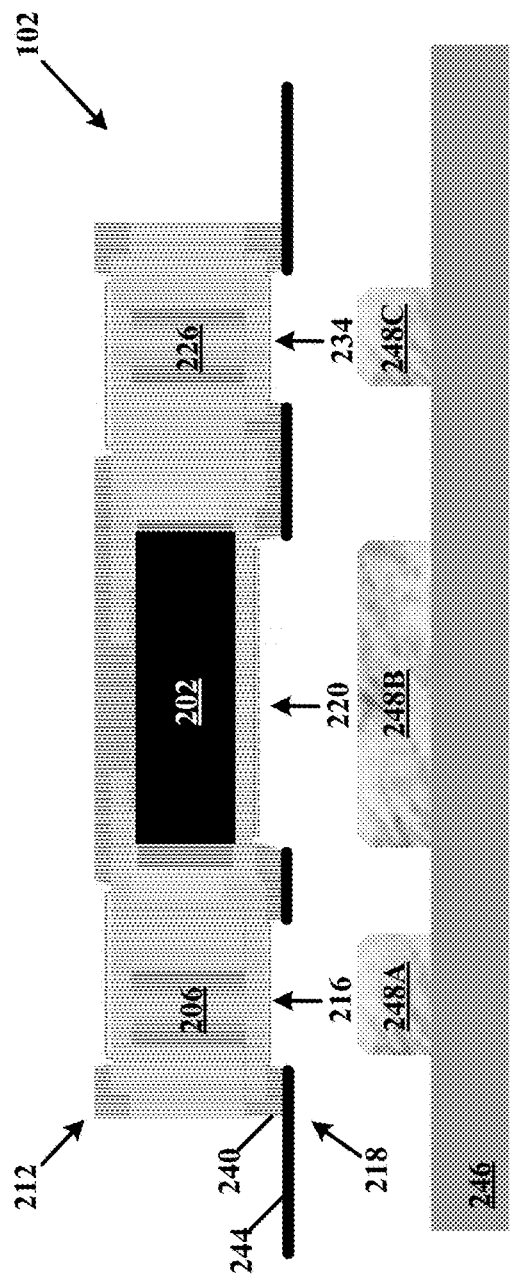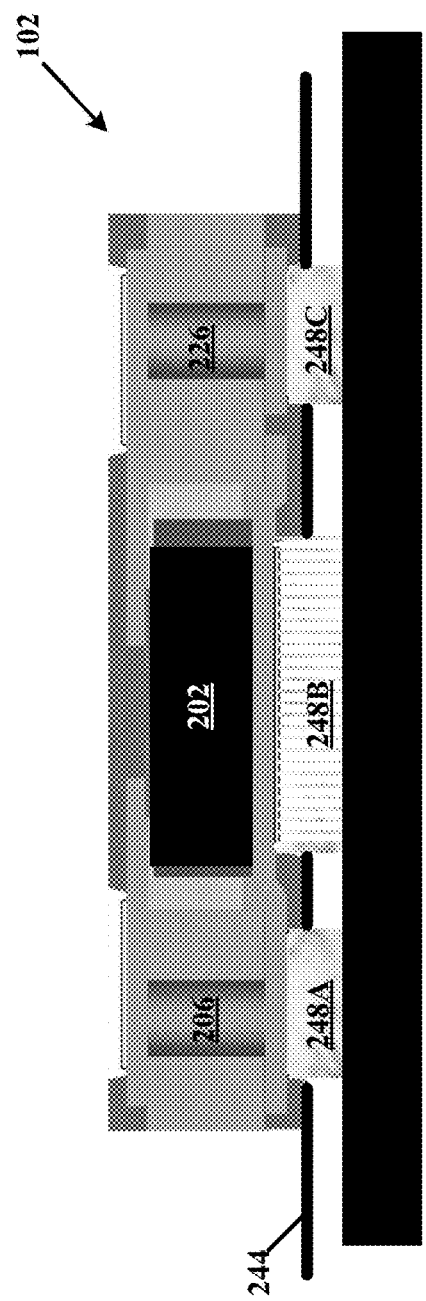

INPUT/OUTPUT PINS FOR CHIP-EMBEDDED SUBSTRATE

The present application is a divisional of U.S. application Ser. No. 15/339,621, filed Oct. 31, 2016, the entirety of which is hereby incorporated by reference.

BACKGROUND

Surface-mount technology is a production method for electronics that involves attaching passive or active components, such as those realized by chip-embedded packaging technologies for example, to a printed circuit board. Such components may be soldered to the printed circuit board to establish connections with other components mounted to the printed circuit board.

SUMMARY

The present disclosure relates to input/output (I/O) pins for a chip-embedded substrate (CES). In an aspect, a method comprises applying a contact-distinct volume of solder to at least two contacts that are recessed within a CES, temperature-cycling the CES to induce solder reflow and define an I/O pin for each one of the at least two contacts, and machining the I/O pin for each one of the at least two contacts to extend exposed from the CES to a common height within specification tolerance. It is contemplated that the I/O pins may be defined or fabricated by a manufacturer of the CES, as opposed to an immediate customer of the manufacturer. Such an implementation represents a paradigm shift in that the manufacturer of the CES may assume the burden of quality control with respect to minimizing unintended solder void trapping under the I/O pins, thereby reinforcing existing customer loyalty and potentially attracting new customers. This is because both existing and potential new customers may realize a substantial cost savings as their own surface-mount assembly processes may be simplified or streamlined by reducing the number of steps required to surface-mount the CES to a printed circuit board (PCB) in order to produce an electronics product or circuit that incorporates or leverages the functionality of the CES. Additionally, the cost savings may propagate through the supply chain all the way to the ultimate consumer electronics customer.

BRIEF DESCRIPTION OF DRAWINGS

FIGS. 3-6 show the CES of FIG. 2 at various steps during a process of defining a plurality of I/O pins in accordance with the disclosure.

DETAILED DESCRIPTION

Figure 1:
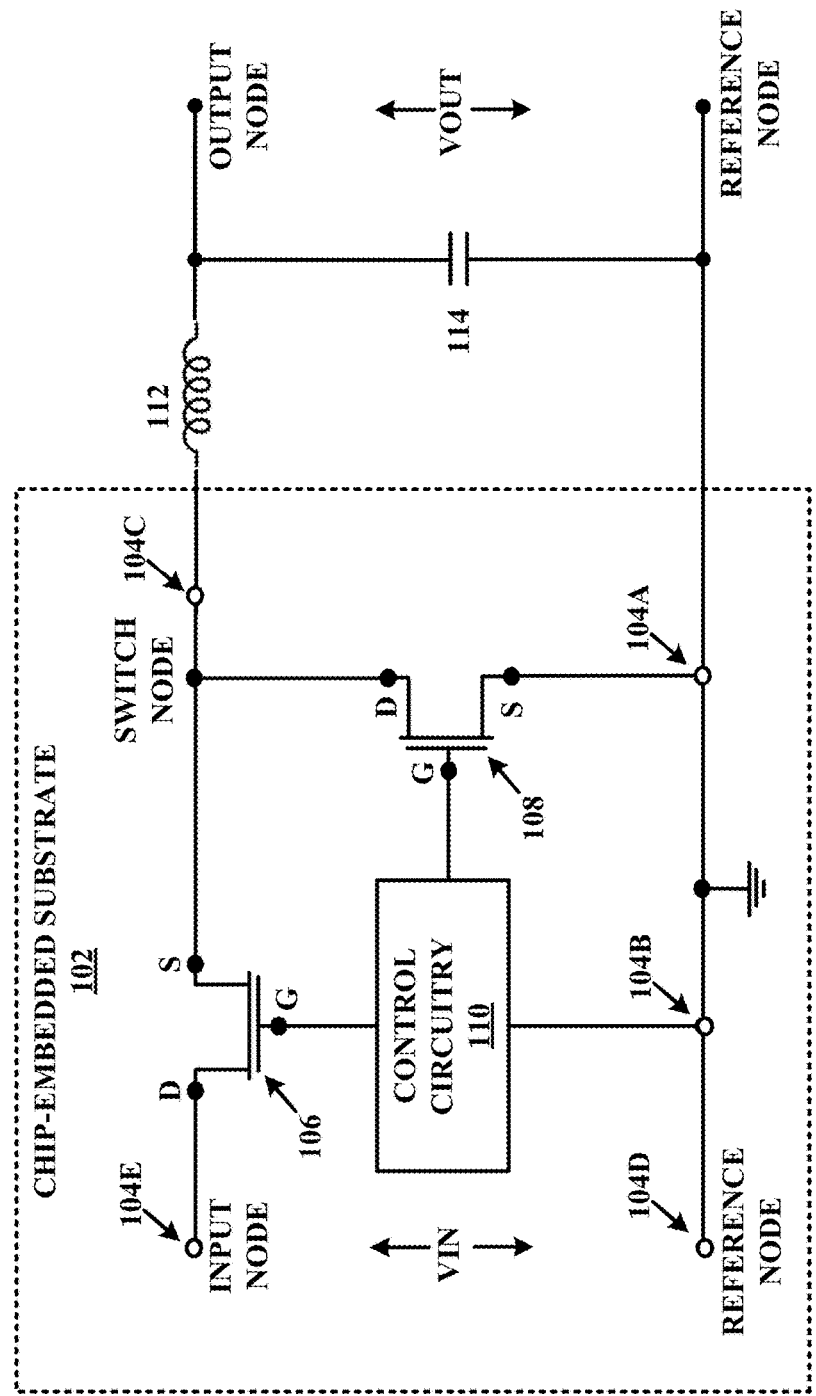
FIG. 1 shows a schematic diagram of a power converter built around a CES that itself includes a plurality of I/O pins defined in accordance with the disclosure.

FIG. 1 shows a schematic diagram of a power converter 100 built around a CES 102 that includes a plurality of I/O pins 104A-E (collectively, "I/O pins 104") defined in accordance with the present disclosure. It is contemplated that I/O pins 104 may be defined or fabricated by a manufacturer of CES 102, as opposed to an immediate customer of the manufacturer. Such an implementation represents a paradigm shift in that the manufacturer of CES 102 may assume the burden of quality control with respect to minimizing unintended solder void trapping under I/O pins 104. Short term, a degradation in performance of power converter 100 attributable to solder voids under I/O pins 104, due to a defect-related series resistance, may occur if the solder voids are relatively large and/or significant in terms of density. By assuming the burden of quality control with respect to minimizing unintended solder void trapping under I/O pins 104, the manufacturer of CES 102 can better insure that rated device level characteristics of CES 102 are realized, as opposed to being inadvertently compromised by the immediate customer during their own processes for surface-mounting CES 102 to a substrate such as a PCB to produce power converter 100. By extension, the reputation of the manufacturer for producing high-performance devices (i.e., CES 102) may be protected and not threatened due to a perceived degradation in performance that is not attributable to CES 102.

With respect to power converter 100, power converter 100 may comprise a multi-phase power converter, such as a half-bridge DC-DC buck converter for converting an input DC signal to an output DC signal with a stepped-down voltage. For each phase, a multi-phase power converter may comprise a half-bridge circuit and an inductor. As a DC-to-DC buck converter, power converter 100 may operate as a voltage regulator in a variety of applications. In some examples, power converter 100 may be designed for high-power applications that leverage high currents and/or voltages. However, the techniques of the present disclosure may apply to other circuits and configurations, such as other types of power converters and including multi-phase power converters.

In the example shown, power converter 100 includes transistors 106, 108 and control circuitry 110 coupled together in a particular topology. Although, power converter 100 may include more or fewer components than depicted in FIG. 1. Power converter 100 further includes an input node that corresponds to an instance of I/O pin 104E, a switch node that corresponds to an instance of I/O pin 104C, and a reference node that corresponds to an instance of (discussed further below) at least one of I/O pins 104A, 104B, 104D, as well as other nodes not explicitly shown in FIG. 1. In general, each one of the mentioned nodes is configured to connect to one or more external components.

For example, the input node may connect to a power supply, the switch node may connect to an inductor 112 that in turn is connected to a capacitor 114 as shown in FIG. 1, and the reference node may connect to a reference voltage, such as reference ground. Additionally, control circuitry 110 may connect to reference ground and a circuit that is external CES 102 through a node that is not shown. And, while inductor 112 and capacitor 114 are each depicted in FIG. 1 as being external to CES 102, CES 102 may in some examples be fabricated such that the inductance and capacitance presented by inductor 112 and capacitor 114, respectively, may be realized within or by CES 102 (e.g., via parasitic L/C introduced by the package of CES 102, etc.).

Although each one of transistors 106, 108 is depicted in FIG. 1 as a metal-oxide-semiconductor field-effect transistor (MOSFET), it is contemplated that any electrical device whose electrical properties are voltage-controllable may be leveraged. For example, transistors 104, 106 may comprise bipolar junction transistors (BJTs), insulated-gate bipolar transistors (IGBTs), high-electron-mobility transistors (HEMTs), gallium-nitride-based transistors (GaNTs), and/or other elements that are voltage-controllable. Further, transistors 106, 108 may comprise n-type transistors or p-type transistors. For example, an n-type MOSFET may include an n-channel for electrons to flow through a p-substrate between load terminals. In some examples, transistors 106, 108 may comprise other voltage-controlled devices, such as diodes. Transistors 106, 108 may also include freewheeling diodes connected in parallel with transistors to prevent reverse breakdown of transistors 106, 108. In some examples, transistors 106, 108 may operate as switches or as voltage-controlled resistor devices.

In an example, transistors 106, 108 may comprise vertical power transistors. For a vertical power transistor, the source terminal and the drain terminal may be on opposite sides or opposite surfaces of the transistor. Drain-source current in a vertical power transistor may flow through the transistor from top-bottom or from bottom-top. In still other examples, transistors 106, 108 may include more than two transistors, such as in multi-phase power converters or other more complex power circuits. For example, in a multi-phase power converter, power converter 100 may have one high-side transistor and one low-side transistor for each phase. Therefore, a multi-phase power converter may include one or more replications of power converter 100 as depicted in FIG. 1.

FIG. 1 depicts transistors 106, 108 with three terminals: drain (D), source (S), and gate (G). The drain and source may be load terminals, and the gate may be a control terminal. Current may flow between the drain and source of transistors 106, 108, based on the voltage at the gate. More specifically, current may flow from the input node to the switch node as shown in FIG. 1 via the drain and source of transistor 106, based on the voltage at the gate of transistor 106. Current may flow from the switch node through the drain and source of transistor 108 to the reference node, as shown in FIG. 1, based on the voltage at the gate of transistor 108. Transistor 106 may comprise a high-side transistor, and the transistor 108 may comprise a low-side transistor.

Transistors 106, 108 may comprise various material compounds, such as silicon (Si), silicon carbide (SiC), gallium nitride (GaN), or any other combination of one or more semiconductor materials. To take advantage of higher power density requirements in some circuits, power converters may operate at higher frequencies. Improvements in magnetics and faster switching, such as GaN switches, may support higher frequency converters. These higher frequency circuits may require control signals to be sent with more precise timing than for lower frequency circuits.

Control circuitry 110 may deliver modulation signals, such as pulse-width modulated (PWM) signals, pulse density modulation (PDM) signals, or other modulation signals to the control terminals of transistors 106, 108. FIG. 1 depicts control circuitry 110 as one component, but control circuitry 110 may comprise a modulation control circuit and a driver circuit as separate components. In such an implementation, one or both of the PWM control circuit and the driver circuit may be located external to power converter 100. Together, transistors 106, 108 and control circuitry 110 as shown in FIG. 1 may comprise a semiconductor device package, such as a chip-embedded substrate, an integrated circuit, or any other suitable package.

Inductor 112 may comprise a coil inductor or any suitable inductor. Inductor 112 may connect to the switch node and an output node as shown in FIG. 1. Inductor 112 may impede the flow of alternating-current (AC) electricity, while allowing DC electricity to flow between the switch node and the output node. Capacitor 114 may comprise a film capacitor, an electrolytic capacitor, a ceramic capacitor, or any suitable type of capacitor or capacitors. Capacitor 114 may connect to the output node and the reference node. Capacitor 114 may impede the flow of DC current, while allowing AC current to flow between the output node and the reference node. Capacitor 114 may act as a smoothing capacitor for the voltage at the output node to moderate fluctuations in the voltage at the output node.

As mentioned above, it is contemplated that I/O pins 104 may be defined or fabricated by a manufacturer of CES 102, as opposed to an immediate customer of the manufacturer. Additionally, it is contemplated that the architecture of CES 102 may be implementation-specific, and thus may be realized in many different ways. An example of a distinct embedded circuit architecture for CES 102 is shown and discussed in connection with FIG. 2. Another example of a distinct embedded circuit architecture for CES 102 is shown and discussed in connection with FIG. 9. An example method for defining I/O pins 104, irrespective of architecture of CES 102, is shown and discussed in connection with FIG. 13.

Figure 2:
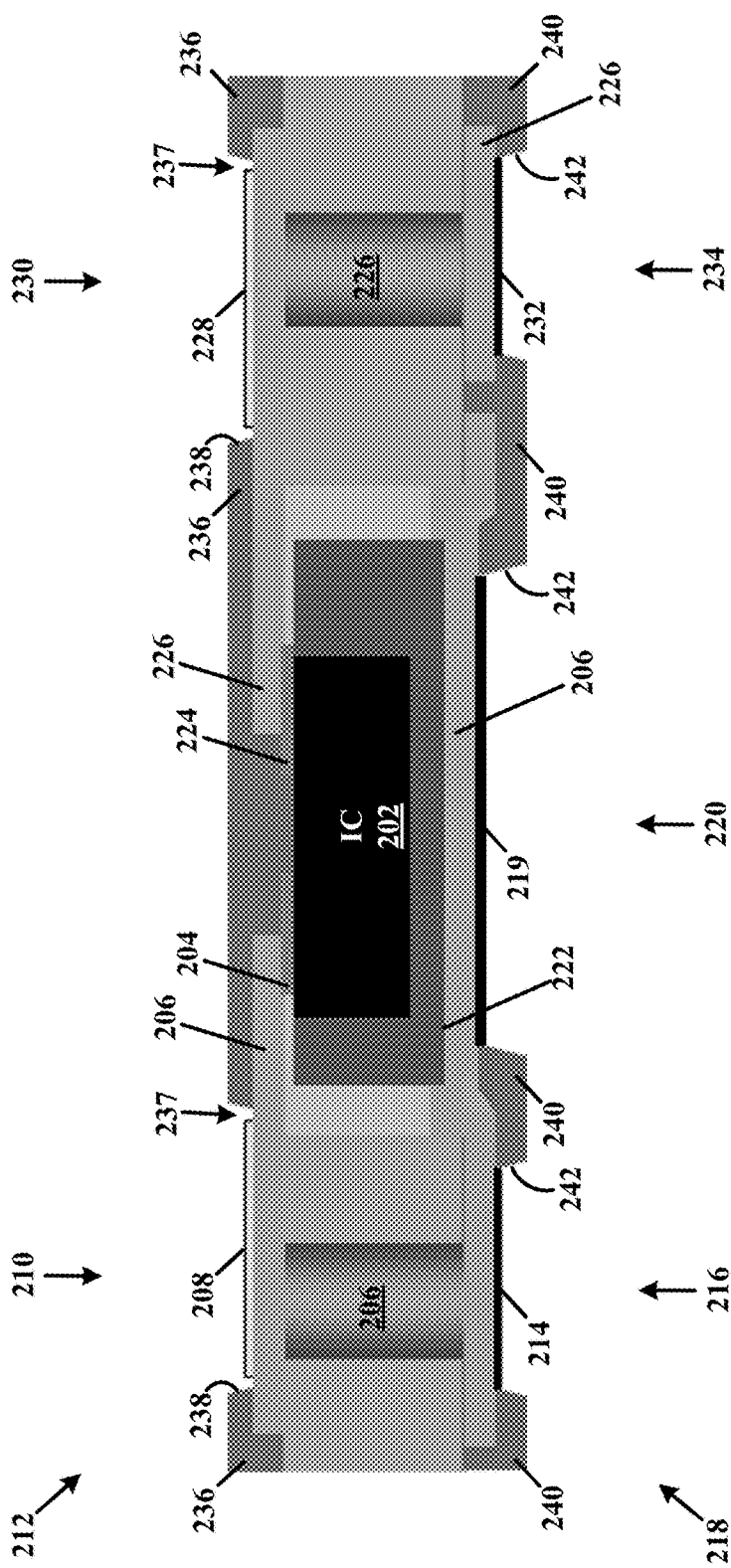
FIG. 2 shows a cross-sectional diagram of the CES of FIG. 1, wherein the CES is realized as a single-chip-embedded substrate.

FIG. 2 shows a cross-sectional diagram of CES 102 of FIG. 1, wherein CES 102 is realized as a single-chip-embedded substrate. Thus, transistors 106, 108 and control circuitry 110 (see FIG. 1) are, collectively, implemented by or as an integrated circuit (IC) 202 that is embedded within CES 102. As depicted, IC 202 is electrically-accessible via each one of a first conductor network and a second conductor network that is at least partially embedded within CES 102.

Specifically, with reference to the upper left-hand side of IC 202 in FIG. 2, the first conductor network comprises (counterclockwise) a first IC contact 204, a first via structure 206, a passivation contact 208 (e.g., Ni/Au, etc.) that is positioned within a first recess 210 of a top side 212 of CES 102, a passivation contact 214 that is positioned within a first recess 216 of a bottom side 218 of CES 102, a passivation contact 219 that is positioned within a second recess 220 of bottom side 218 of CES 102, and an IC contact area 222 that is along an entire side of IC 202. A node defined by the respective elements of the first conductor network corresponds to the reference node of CES 102 as shown in FIG. 1. Thus, the architecture of CES 102 is such that the reference node is accessible from both top side 212 and bottom side 218 of CES 102 where, as discussed below, CES 102 may in one example be surface-mounted to a PCB along bottom side 218 of CES 102.

With reference to the upper right-hand side of IC 202 in FIG. 2, the second conductor network comprises (clockwise) a third IC contact 224, a second via structure 226, a passivation contact 228 that is positioned within a second recess 230 of top side 212 of CES 102, and a passivation contact 232 that is positioned within a third recess 234 of bottom side 218 of CES 102. A node defined by the respective elements of the second conductor network corresponds to the switch node as shown in FIG. 1. Thus, the architecture of CES 102 is such that the switch node is accessible from both top side 212 and bottom side 218 of CES 102.

With reference to top side 212 of CES 102 in FIG. 2, each one of first recess 210 and second recess 230 is formed within a thin-film dielectric 236, and each one of passivation contact 208 of first recess 210 and passivation contact 228 of second recess 230 is positioned at the bottom of first recess 210 and second recess 230, respectively, such that a gap 237 is defined between each one of passivation contact 208 and passivation contact 228 and a beveled surface 238 of dielectric 236. As discussed below, a contact-specific volume of solder may be positioned within each one of first recess 210 and second recess 230 during a process of defining respective I/O pins 104 such that the reference node of CES 102 (see FIG. 1), and the switch node of CES 102, is electrically-accessible from top side 212 of CES 102, and gap 237 may insure that during solder-reflow each one of passivation contact 208 and passivation contact 228 is fully-alloyed. Although, it is contemplated that gap 237 is an optional feature.

With reference to bottom side 218 of CES 102 in FIG. 2, each one of first recess 216, second recess 220 and third recess 234 is formed within a thin-film dielectric 240, and each one of passivation contact 214 of first recess 216, passivation contact 219 of second recess 220 and passivation contact 232 of third recess 234 is positioned immediately adjacent to or abuts a beveled surface 242 of dielectric 240 at the bottom of first recess 216, second recess 220 and third recess 234, respectively. As discussed below, a contact-specific volume of solder may be positioned within each one of first recess 216, second recess 220 and third recess 220 during a process of defining respective I/O pins 104 such that the reference node of CES 102, and the switch node of CES 102, is electrically-accessible from bottom side 218 of CES 102. In some examples, a gap may be defined between any particular one of passivation contact 214, passivation contact 219 and passivation contact 232 and beveled surface 242 of dielectric 240. Although an optional feature, such a gap may be defined as illustrated by gap 237 in FIG. 2.

As mentioned above, a contact-specific volume of solder may be positioned within each one of first recess 210 and second recess 230 of top side 212 of CES 102 during a process of defining I/O pins 104 such that the reference node and the switch node of CES 102 is electrically-accessible from top side 212 of CES 102. Additionally, a contact-specific volume of solder may be positioned within each one of first recess 216, second recess 220 and third recess 220 during a process of defining I/O pins 104 such that the reference node and the switch node of CES 102, is electrically-accessible from bottom side 218 of CES 102.

As an example, a contact-specific volume of solder may be positioned within first recess 210 of top side 212 of CES 102 during a process of defining an instance of I/O pin 104D (see FIG. 1), and a contact-specific volume of solder may be positioned within second recess 230 of top side 212 of CES 102 during a process of defining an instance of I/O pin 104C. Additionally, a contact-specific volume of solder may be positioned within first recess 216 of bottom side 218 of CES 102 during a process of defining an instance of I/O pin 104A, a contact-specific volume of solder may be positioned within second recess 220 of bottom side 218 of CES 102 during a process of defining an instance of I/O pin 104B, and a contact-specific volume of solder may be positioned within third recess 234 of bottom side 218 of CES 102 during a process of defining an instance of I/O pin 104C. Further, it is contemplated that a contact-specific volume of solder may be positioned within one or more recesses along top side 212 and/or bottom side 218 of CES 102 not explicitly shown in FIG. 2.

As an example, a contact-specific volume of solder may be positioned within a recess (not shown, but may be similar to any one of recess 210, recess 216, recess 220 of FIG. 2) along top side 212 of CES 102 during a process of defining an instance of I/O pin 104E (see FIG. 1). Additionally, or alternatively, a contact-specific volume of solder may be positioned within a recess (not shown, but may be similar to any one of recess 210, recess 216, recess 220 of FIG. 2) along bottom side 218 of CES 102 during a process of defining an instance of I/O pin 104E. In these and other examples, the phrase "an instance of" is intended to indicate that the architecture of CES 102 is such that any particular one of I/O pins 104 may be defined so that any particular node of CES 102 is electrically-accessible from top side 212 and/or bottom side 218 of CES 102 (e.g., similar to the switch node as shown in FIG. 2, etc.). FIGS. 3-6 show CES 102 at various steps during a process of defining I/O pins 104 in accordance with the present disclosure.

Specifically, FIGS. 3-6 show CES 102 of FIG. 2 at various steps during a process of defining I/O pins 104A-C such that the reference node and the switch node of CES 102 is electrically-accessible from bottom side 218 of CES 102. It is contemplated that the same and other steps may be implemented during a process of defining I/O pins 104 such that the reference node and the switch node of CES 102 is electrically-accessible from top side 212 of CES 102. By extension, it is contemplated that the same and other steps may be implemented during a process of defining I/O pins 104 such that any particular node of CES 102 is electrically-accessible from one or both of top side 212 and bottom side 218 of CES 102.

FIG. 3 shows a mask 244 positioned to dielectric 240 of bottom side 218 of CES 102, and a substrate 246 that is aligned with CES 102 such that each one of a plurality of solder balls 248A-C (collectively, "solder balls 248"), as arranged in a particular pattern on substrate 246, is aligned with a corresponding aperture formed within mask 244. Each one of solder balls 248 has a contact-specific volume of solder. In these and other examples, the phrase "a contact-specific volume of solder" is intended to indicate that a particular amount of solder material is deposited within each one of first recess 216, second recess 220, and third recess 234 of bottom side 218 of CES 102 during a process of defining respective instances of I/O pins 104. In the example of FIG. 3, solder balls 248A and 248C exhibit an approximately same volume of solder that is different than solder ball 248B. This is because respective dimensions (e.g., depth, height, differential cross-sectional area, etc.) of each one of first recess 216 and third recess 234 is approximately the same, but different than respective dimensions of second recess 220, such that the shape and form of first recess 216 is approximately the same as the shape and form of third recess 234. Shape and form of first recess 216 and third recess 234 may be "approximately" but not precisely the same because of variations introduced during the manufacture of CES 102.

FIG. 4 shows each one of solder balls 248 positioned to a corresponding one of first recess 216, second recess 220 and third recess 234 of bottom side 218 of CES 102, through a corresponding aperture formed within mask 244. In practice, solder may be positioned to first recess 216, second recess 220 and third recess 234 through a corresponding aperture formed within mask 244 by many different techniques. For example, instead of the substrate-based implementation as shown in FIGS. 3-4, a screen-printing technique may be used during a process of defining I/O pins 104. Other examples are possible as well.

Figure 5:
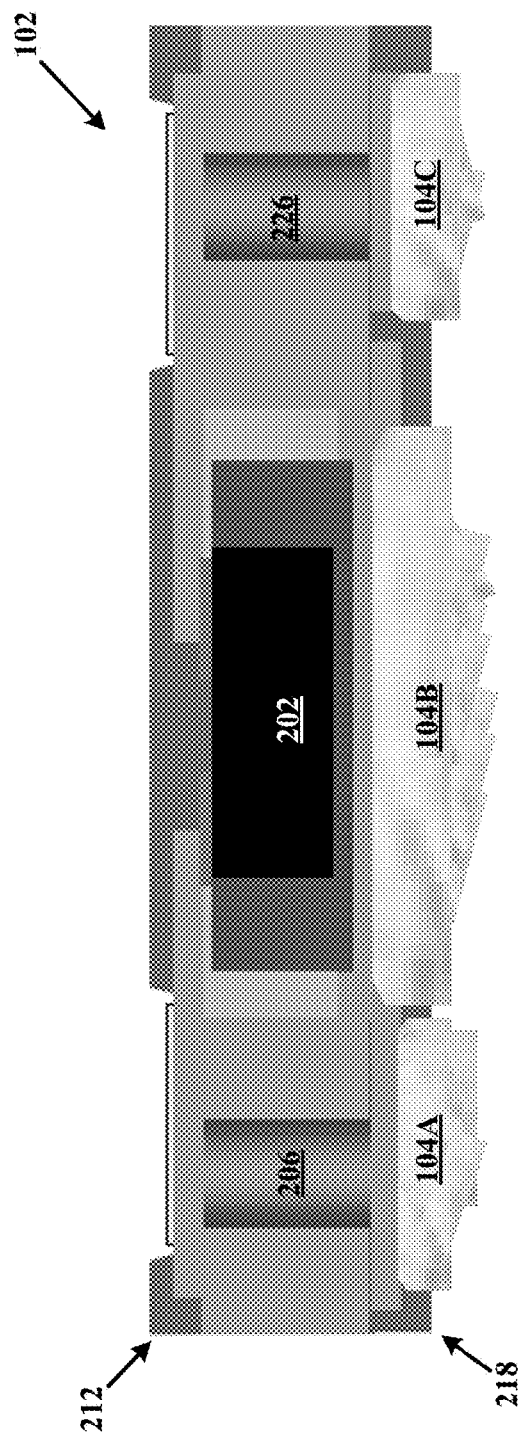
Figure 6:
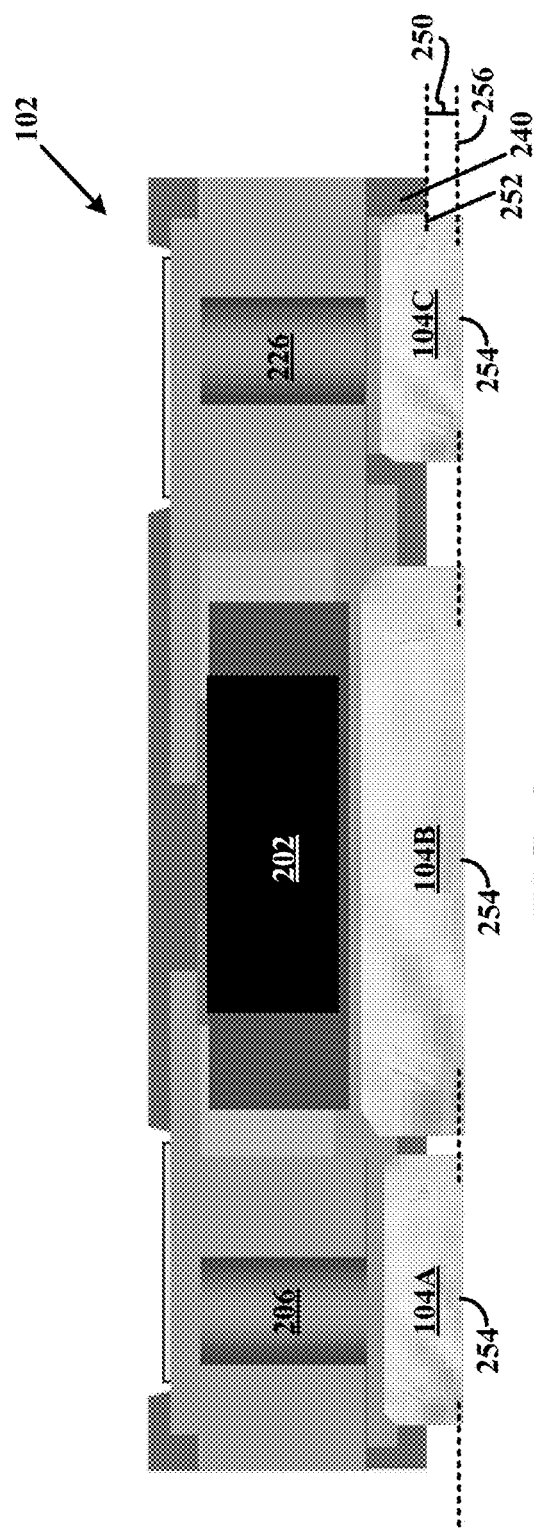

Once each one of solder balls 248 is positioned to a corresponding one of first recess 216, second recess 220 and third recess 234, as shown in FIG. 4, solder-reflow and pin-machining processes may be performed to define I/O pins 104A-C. FIG. 5 shows I/O pins 104A-C immediately following solder-reflow processes (e.g., temperature-cycling, re-flux, drying bake, etc.), and thus each one of I/O pins 104A-C as extending from dielectric 240 of CES 102 exhibits an irregular or unshaped form. FIG. 6 shows I/O pins 104A-C immediately following pin-machining processes (e.g., grinding or etching, polishing, etc.), and thus each one of I/O pins 104A-C as extending from dielectric 240 exhibits a regular or shaped form. In particular, FIG. 6 shows each one of I/O pins 104A-C machined so as to extend from CES 102 to a common height 250 within specification tolerance (lower left-hand side).

Figure 7:
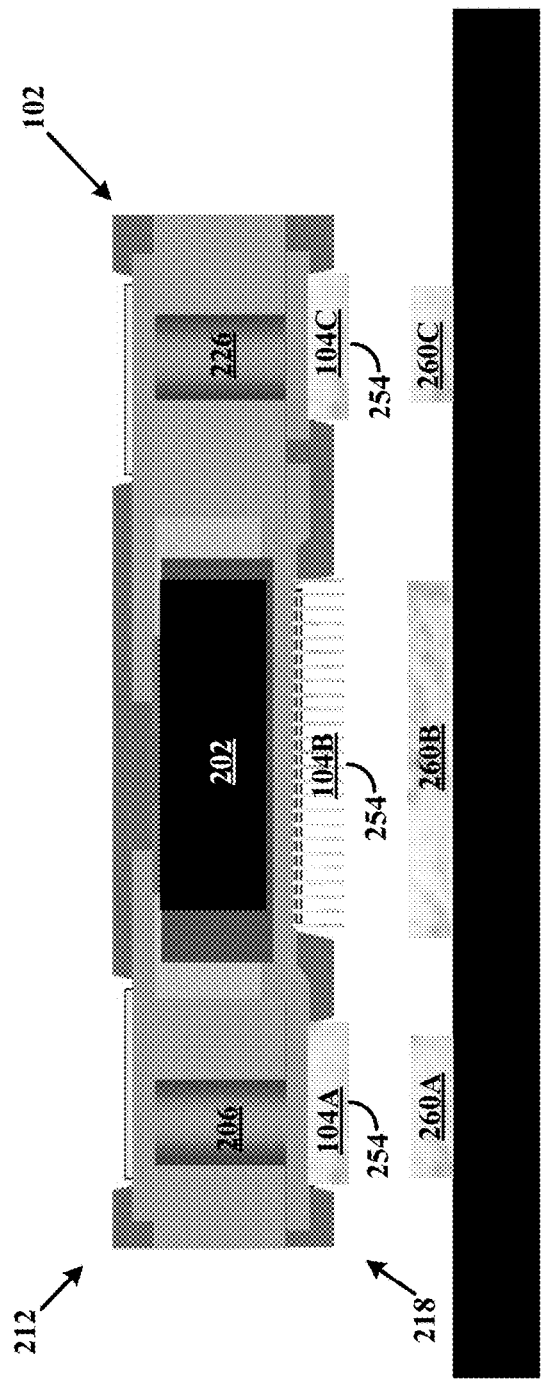
FIGS. 7-8 show the CES of FIG. 2 at various steps during a process of surface-mounting the CES to a PCB in accordance with the disclosure.
Figure 8:
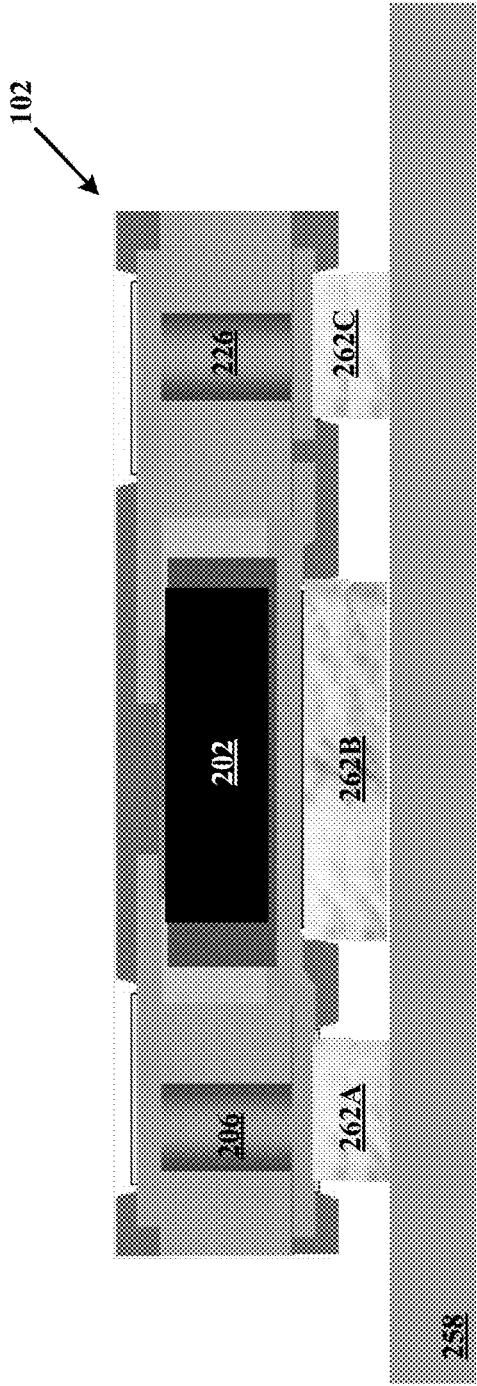

The phrase "to a common height within specification tolerance" is intended to indicate that each one of I/O pins 104 may not extend precisely to height 250 as measured from surface 252 of dielectric 240 to a flat end surface 254 of I/O pins 104, as shown in FIG. 6, but that there may be some variance or variation (e.g., +/−2 µm, etc.) such that on the macroscale end surface 254 of each one I/O pins 104A-C may exhibit roughness and/or not lie precisely in plane 256. However, on the microscale, and to the naked eye, end surface 254 of each one I/O pins 104A-C may appear to lie precisely within plane 256, co-planar. It is contemplated that such co-planarity may facilitate precision surface-mounting of CES 102 to a PCB along bottom surface 218 of CES 102, and at low-cost and without risk of unintended solder void trapping under I/O pins 104 as, in each one of the examples of the disclosure, I/O pins 104 are (pre-)defined by a manufacturer of the CES 102. FIGS. 7-8 show CES 102 at various steps during a process of surface-mounting CES 102 to a PCB in accordance with the present disclosure.

Specifically, FIG. 7 shows a PCB 258 that is aligned with CES 102 such that each one of a plurality of contact pads 260A-C (collectively, "contact pads 260"), as arranged in a particular pattern on PCB 258, is aligned with a corresponding one of I/O pins 104A-C. FIG. 8 shows CES 102 surface-mounted to PCB 258 along bottom surface 218 of CES 102 by contacts 262A-C (collectively, "contacts 262") which are formed by joining I/O pins 104A-C with corresponding ones of contact pads 260A-C.

Figure 9:
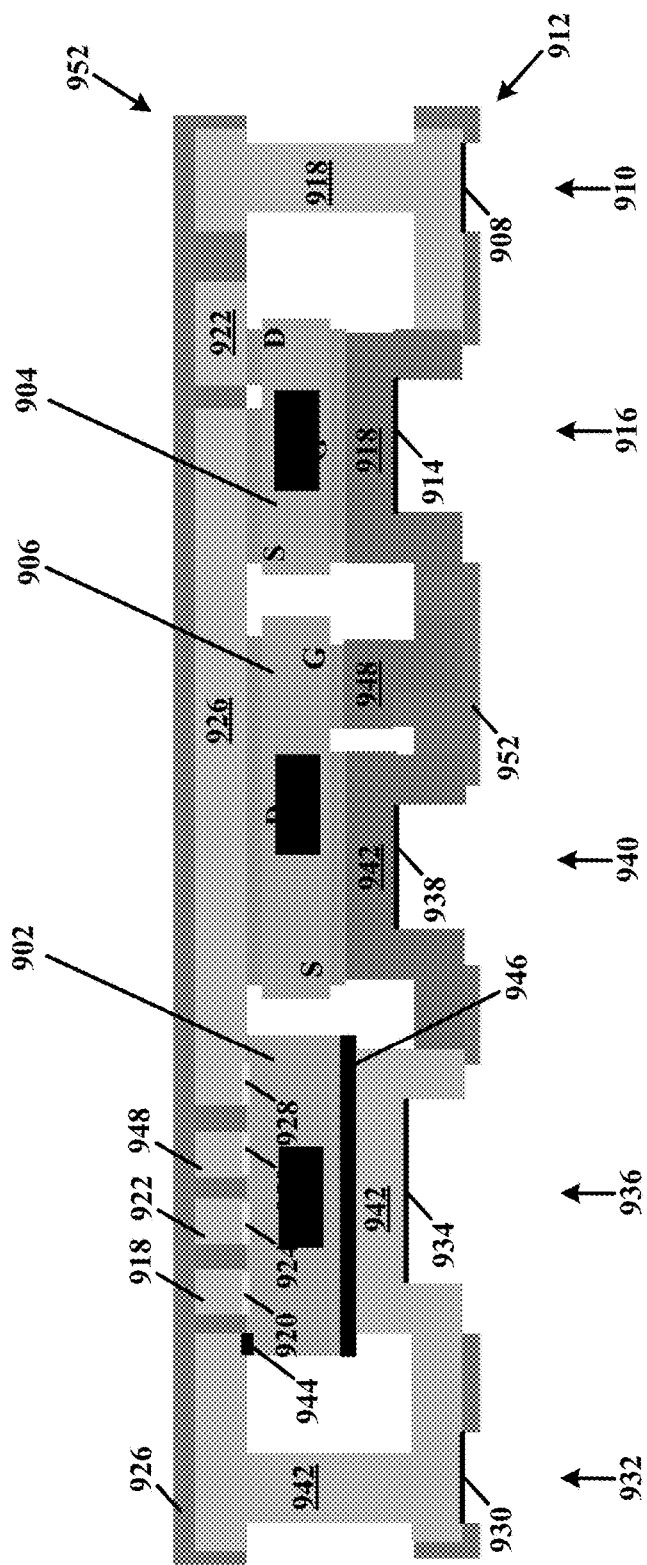
FIG. 9 shows a cross-sectional diagram of the CES of FIG. 1, wherein the CES is realized as a multi-chip-embedded substrate.

FIG. 9 shows a cross-sectional diagram of CES 102 of FIG. 1, wherein CES 102 is realized as a multi-chip-embedded substrate. Thus, each one of transistors 106, 108 and control circuitry 110 (see FIG. 1) is implemented by or as a discrete component that is embedded within CES 102. Specifically, control circuitry 110 is implemented by or as an integrated circuit (IC) 902 in the example of FIG. 9, transistor 106 is implemented by or as a vertical power transistor 904 in the example of FIG. 9, and transistor 108 is implemented by or as a vertical power transistor 906 in the example of FIG. 9.

In this example, with reference to the bottom right-hand side of FIG. 9, a passivation contact 908 that is positioned within a first recess 910 of a bottom side 912 of CES 102 is, together with a passivation contact 914 that is positioned within a second recess 916 of bottom side 912 of CES 102, connected to a first via structure 918 that is embedded within CES 102. Electrically, first via structure 918 corresponds to the input node of CES 102 (see FIG. 1). With additional reference to the upper left-hand side of FIG. 9, IC 902 is connected to first via structure 918 by a first IC contact 920, and first via structure 918 is connected to the gate node of transistor 904 (see transistor 106 in FIG. 1). Further, IC 902 is connected to a first conductor structure 922 that is embedded within CES 102 by a second IC contact 924, and first conductor structure 922 is connected to the drain node of transistor 904. Further, IC 902 is connected to a second conductor structure 926 that is embedded within CES 102 by a third IC contact 928, and second conductor structure 926 is connected to both the source node of transistor 904 and to the drain node of transistor 906 (see transistor 108 in FIG. 1). Electrically, second conductor structure 926 corresponds to the switch node of CES 102.

With reference to the bottom left-hand side of FIG. 9, a passivation contact 930 that is positioned within a third recess 932 of bottom side 912 of CES 102 is, together with a passivation contact 934 that is positioned within a fourth recess 936 and a passivation contact 938 that is positioned within a fifth recess 940 of bottom side 912 of CES 102, connected to a second via structure 942 that is embedded within CES 102. IC 902 is connected to second via structure 942 by a fourth IC contact 944 and by a backside contact 946 to IC 902 that in turn is connected the source node of transistor 906 (see FIG. 1). Electrically, second via structure 942 corresponds to the reference node of CES 102. Further, IC 902 is connected to a third conductor structure 948, that is embedded within CES 102, by a fifth IC contact 950, and third conductor structure 948 is connected to the gate node of transistor 906.

Similar to the example of FIG. 2, a contact-specific volume of solder may be positioned within each one of first recess 910, second recess 916, third recess 932, fourth recess 936 and fifth recess 940 of bottom side 912 of CES 102 during a process of defining respective I/O pins 104. As an example, a contact-specific volume of solder may be positioned within first recess 910, and within second recess 916, of bottom side 912 of CES 102 during a process of defining an instance of I/O pin 104E (see FIG. 1), and a contact-specific volume of solder may be positioned within third recess 932, and within fourth recess 936 and within fifth recess 940, of bottom side 912 of CES 102 during a process of defining an instance of I/O pins 104D, 104B and 104A, respectively. Additionally, it is contemplated that a contact-specific volume of solder may be positioned within one or more recesses along a top side 952 and/or bottom side 912 of CES 102 not explicitly shown in FIG. 9.

Figure 10:
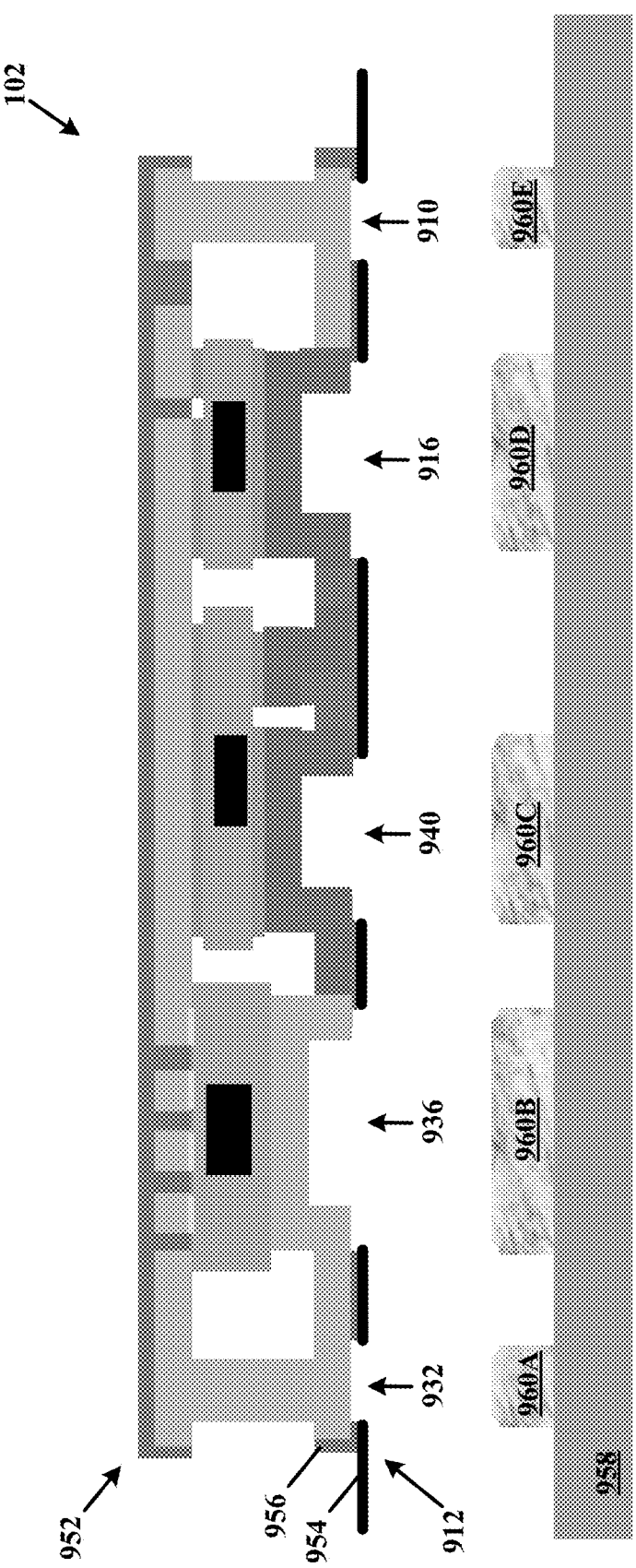
FIG. 10 shows the CES of FIG. 9 at a step during a process of defining a plurality of I/O pins in accordance with the disclosure.
Figure 11:
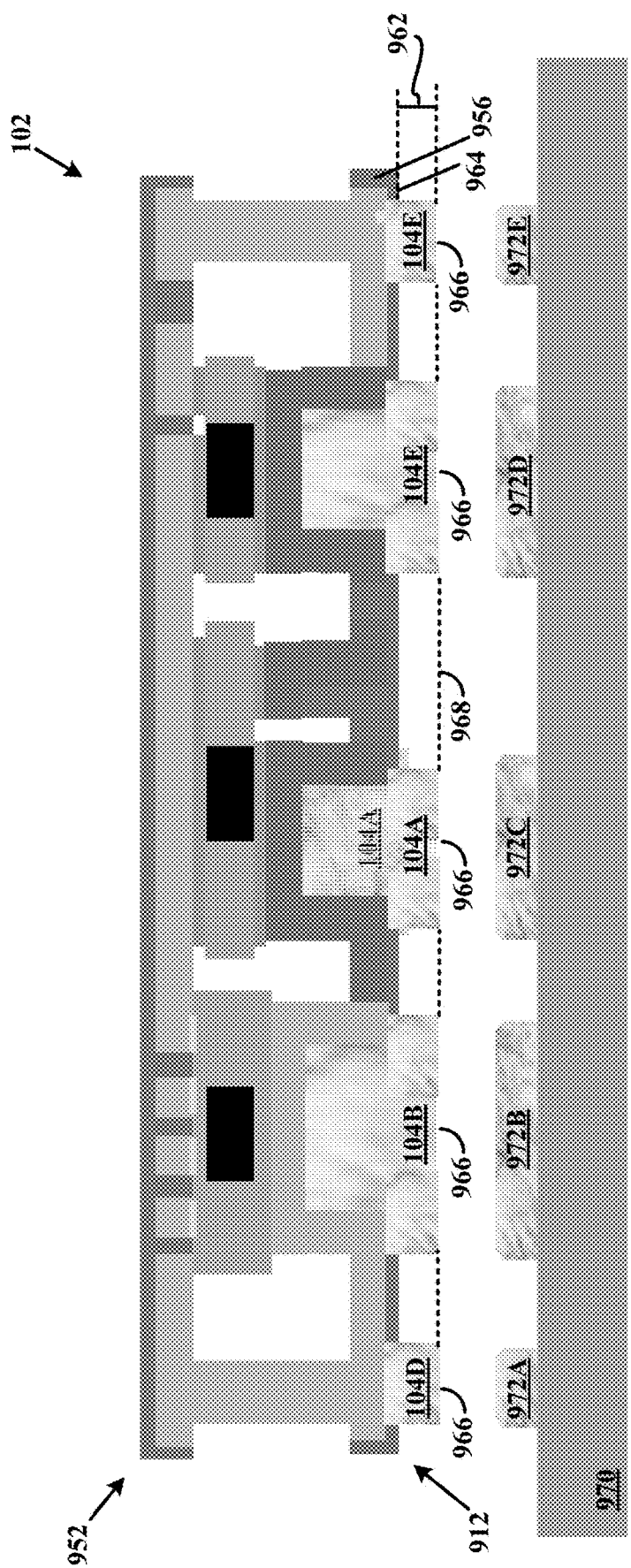
FIGS. 11-12 show the CES of FIG. 9 at various steps during a process of surface-mounting the CES to a PCB in accordance with the disclosure.

As an example, a contact-specific volume of solder may be positioned within a recess (not shown, but may be similar to any one of recess 910, recess 916, recess 932, recess 936, recess 940 of FIG. 2) along top side 952 and/or bottom side 912 of CES 102 during a process of defining an instance of I/O pin 104C (see FIG. 1). In these and other examples, the phrase "an instance of" is intended to indicate that the architecture of CES 102 may be such that any particular one of I/O pins 104 may be defined or fabricated such that any particular node of CES 102 is electrically-accessible from top side 952 and/or bottom side 912 of CES 102. FIGS. 10-11 show CES 102 at various steps during a process of defining I/O pins 104 in accordance with the present disclosure.

Specifically, FIGS. 10-11 show CES 102 of FIG. 9 at various steps during a process of defining I/O pins 104A, 104B, 104D, 104E such that the reference node of CES 102, and the input node of CES 102, is electrically-accessible from bottom side 912 of CES 102. It is contemplated that the same and other steps may be implemented during a process of defining I/O pins 104 such that the reference node of CES 102, and the input node of CES 102, is electrically-accessible from top side 952 of CES 102. By extension, it is contemplated that the same and other steps may be implemented during a process of defining I/O pins 104 such that any particular node of CES 102 is electrically-accessible from one or both of top side 952 and bottom side 912 of CES 102.

FIG. 10 shows a mask 954 positioned to a dielectric 956 of bottom side 912 of CES 102, and a substrate 958 that is aligned with CES 102 such that each one of a plurality of solder balls 960A-C (collectively, "solder balls 960"), as arranged in a particular pattern on substrate 958, is aligned with a corresponding aperture formed within mask 954. In this example, solder balls 960A and 960E and, separately, solder balls 960C and 960D, exhibit an approximately same volume of solder that is different than solder ball 960B. This is because respective dimensions of each one of third recess 932 and first recess 910 and, separately, each one of fifth recess 940 and second recess 916, are approximately the same, but different than respective dimensions of fourth recess 940. Shape and form of particular recesses of FIG. 9 may be "approximately" but not precisely the same because of variations introduced during the manufacture of CES 102.

Once each one of solder balls 960 is positioned to a corresponding one of first recess 910, second recess 916, third recess 932, fourth recess 936 and fifth recess 940 of bottom side 912 of CES 102, solder-reflow and pin-machining processes may be performed to define respective instances of I/O pins 104. FIG. 11 shows I/O pins 104A, 104B, 104D and 104E (see FIG. 1) following solder-reflow and pin-machining processes, and thus each one of I/O pins 104A, 104B, 104D and 104E exhibits a regular or shaped form. In particular, FIG. 11 shows each one of I/O pins 104A, 104B, 104D and 104E machined so as to extend from CES 102 to a common height 962 within specification tolerance (lower left-hand side).

The phrase "to a common height within specification tolerance" is intended to indicate that each one of I/O pins 104 may not extend precisely to height 962 as measured from a surface 964 of dielectric 956 to a flat end surface 966 of I/O pins 104, as shown in FIG. 11, but that there may be some variance or variation, such that on the macroscale end surface 966 of each one I/O pins 104 may exhibit roughness and/or not lie precisely in a plane 938. However, on the microscale, and to the naked eye, end surface 966 of each one I/O pins 104 may appear to lie precisely within plane 968, i.e., "co-planar." It is contemplated that such co-planarity may facilitate precision surface-mounting of CES 102 to a PCB along bottom surface 912 of CES 102, and at low-cost and without risk of unintended solder void trapping under I/O pins 104 as, in each one of the examples of the disclosure, I/O pins 104 are (pre-)defined by a manufacturer of the CES 102.

Figure 12:
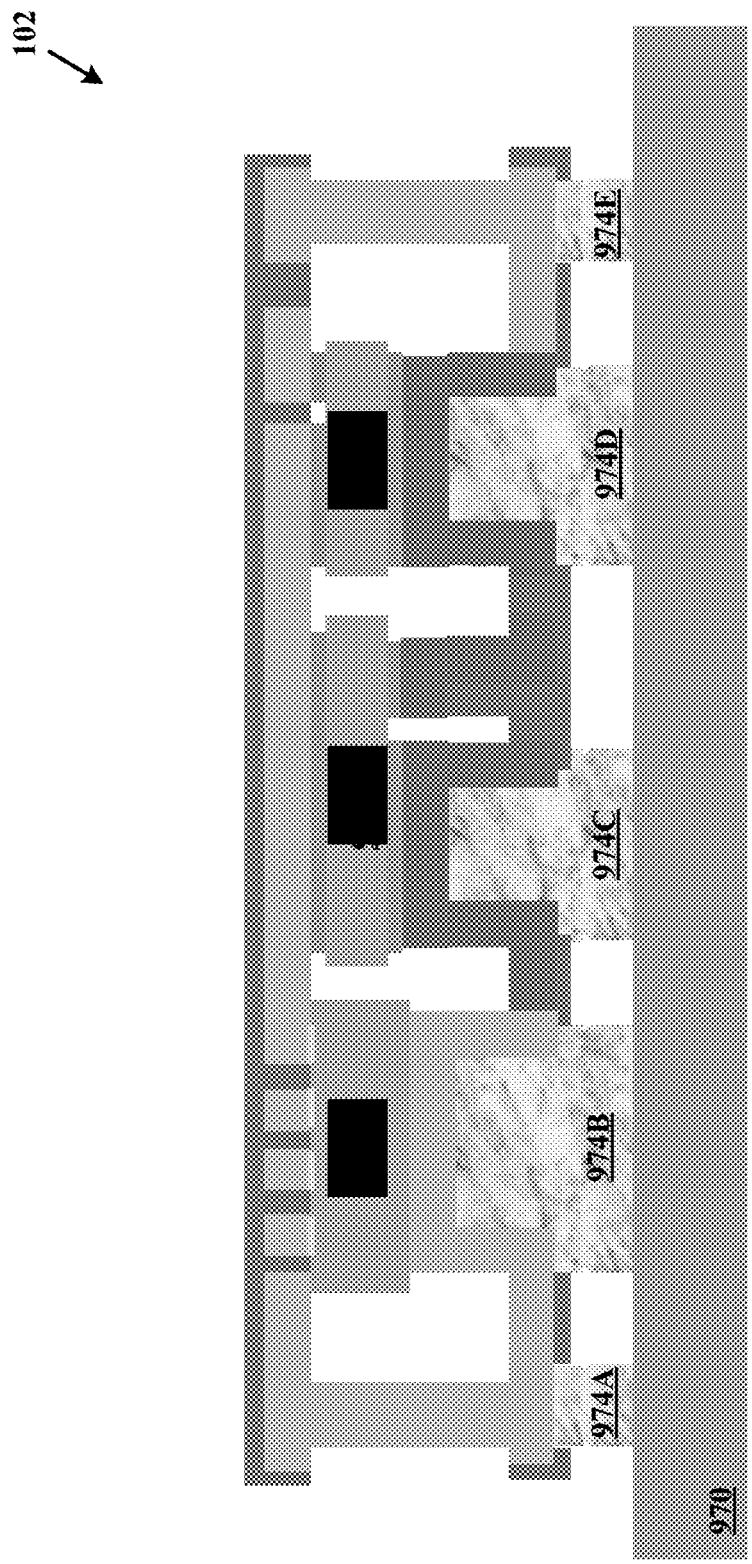

FIG. 11 further shows a PCB 970 that is aligned with CES 102 such that each one of a plurality of contact pads 972A-E (collectively, "contact pads 972"), as arranged in a particular pattern on PCB 970, is aligned with a corresponding one of I/O pins 104A, 104B, 104D and 104E. FIG. 12 shows CES 102 surface-mounted to PCB 970 along bottom surface 912 of CES 102 by contacts 974A-E (collectively, "contacts 974") which are formed by joining I/O pins 104A, 104B, 104D and 104E with corresponding ones of contact pads 972A-E.

Figure 13:
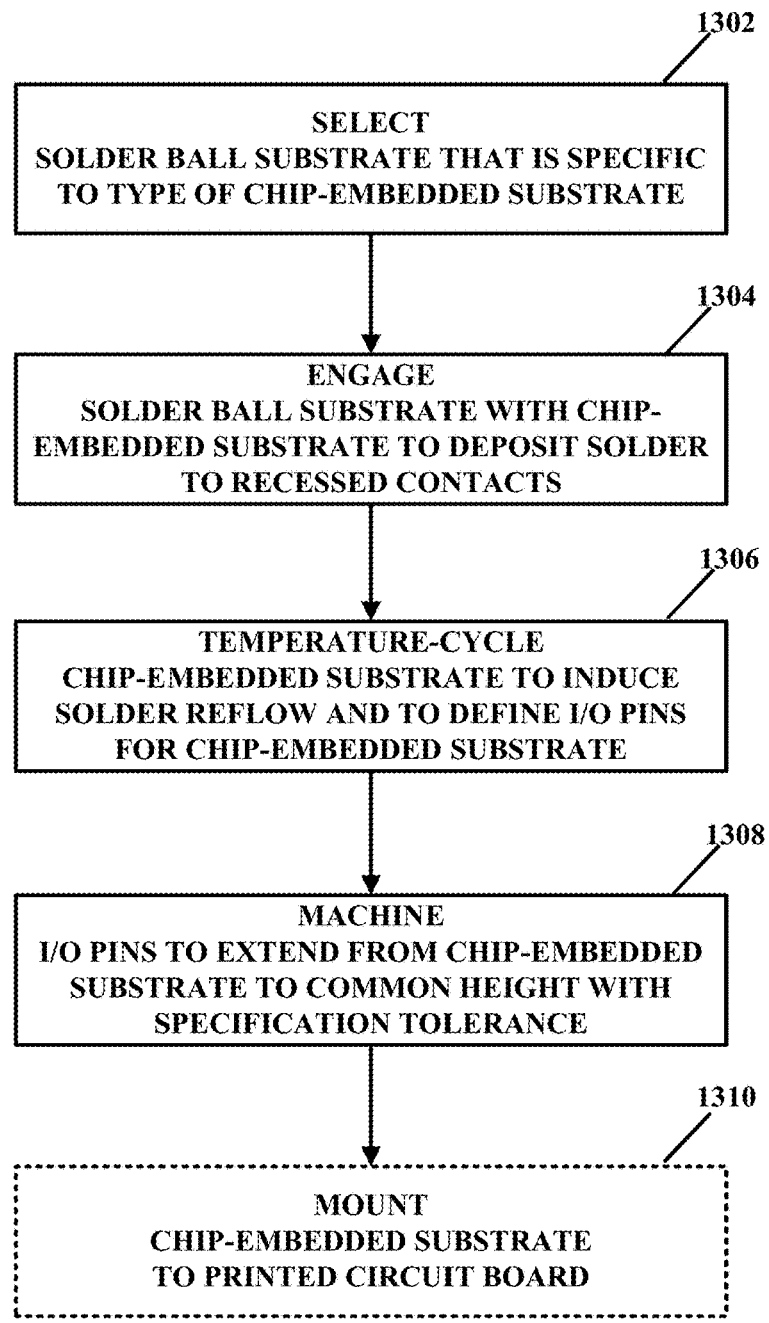
FIG. 13 shows an example method for defining a plurality of I/O pins in accordance with the disclosure.

FIG. 13 shows an example method 1300 for defining a plurality of I/O pins in accordance with the disclosure. The example method 1300 comprises the step of selecting (1302) a substrate that has a solder ball pattern that is specific to a type of CES. An example of such a substrate is shown in FIG. 3 as substrate 246. Another example of such a substrate is shown in FIG. 10 as substrate 958. The example method 1300 further comprises the step of engaging (1304) the substrate that has the solder ball array to the CES to deposit solder to each one of a plurality of contacts of the CES that are recessed within the CES. Another example of such a step is shown in FIG. 4. The example method 1300 further comprises the step of temperature-cycling (1306) the CES to induce solder reflow and define an I/O pin for each one of the contacts of the CES that are recessed within the CES. Another example of such a step is shown in FIG. 5. The example method 1300 further comprises the step of machining (108) the I/O pin for each one of the contacts of the CES that are recessed within the CES to extend exposed from the CES to a common height within specification tolerance. An example of such as step is shown in FIG. 6. Another example of such a step is shown in FIG. 11. The example method 1300 further comprises the step of surface-mounting (1310) the CES to a printed circuit board (PCB) to establish I/O connections through traces to other components and devices surface-mounted to the PCB. An example of such as step is shown in FIG. 8. Another example of such a step is shown in FIG. 12.

The example method 1300 represents a paradigm shift in that the manufacturer of the CES may assume the burden of quality control with respect to minimizing unintended solder void trapping under the I/O pins, thereby reinforcing existing customer loyalty and potentially attracting new customers. This is because both existing and potential new customers may realize a substantial cost savings as their own surface-mount assembly processes may be simplified or streamlined by reducing the number of steps required to surface-mount the CES to a PCB in order to produce an electronics product or circuit that incorporates or leverages the functionality of the CES. Further, the cost savings may propagate through the supply chain all the way to the ultimate consumer electronics customer. Further, the manufacturer of CES can better insure that rated device level characteristics of CES are realized, as opposed to being inadvertently compromised by the immediate customer during their own processes for surface-mounting CES to a substrate such as a PCB to produce an electronics product or circuit that incorporates or leverages the functionality of the CES. By extension, the reputation of the manufacturer for producing high-performance devices may be protected and not threatened due to a perceived degradation in performance that is not attributable to CES.

Additionally, the following numbered examples demonstrate one or more aspects of the disclosure.

Example 1

A method comprising: applying a contact-distinct volume of solder to at least two contacts recessed within a chip-embedded substrate; temperature-cycling the chip-embedded substrate to induce solder reflow and define an input/output pin for each one of the at least two contacts; and machining the input/output pin for each one of the at least two contacts to extend exposed from the chip-embedded substrate to a common height within specification tolerance.

Example 2

The method of example 1, wherein applying the contact-distinct volume of solder comprises: applying a first volume of solder to a first one of the at least two contacts and a second volume of solder that is different than the first volume of solder to a second one of the at least two contacts.

Example 3

The method of any one of examples 1-2, wherein applying the contact-distinct volume of solder comprises: positioning a mask to the chip-embedded substrate so that a first aperture of the mask is aligned with a first one of the at least two contacts and a second aperture of the mask that is sized different than the first aperture is aligned with a second one of the at least two contacts.

Example 4

The method of any one of examples 1-3, wherein applying the contact-distinct volume of solder comprises: aligning a substrate that has a particular solder ball pattern with the chip-embedded substrate; and engaging the substrate that has the particular solder ball pattern to the chip-embedded substrate so that a first volume of solder is applied to a first one of the at least two contacts and a second volume of solder that is different than the first volume of solder is applied to a second one of the at least two contacts.

Example 5

The method of any one of examples 1-4, wherein applying the contact-distinct volume of solder comprises: selecting a substrate from among a plurality of substrates each one that exhibits a solder ball pattern specific to a type of chip-embedded substrate; aligning the substrate with the chip-embedded substrate; and engaging the substrate that has the particular solder ball pattern to the chip-embedded substrate so that a first volume of solder is applied to a first one of the at least two contacts and a second volume of solder that is different than the first volume of solder is applied to a second one of the at least two contacts.

Example 6

The method of any one of examples 1-5, further comprising: selecting the chip-embedded substrate from among a plurality of chip-embedded substrates each one that exhibits a distinct embedded circuit architecture.

Example 7

The method of any one of examples 1-6, further comprising: selecting the chip-embedded substrate from among a plurality of chip-embedded substrates each one that exhibits a distinct embedded circuit architecture, wherein the chip-embedded substrate comprises an integrated circuit and a plurality of through-via conductors each one that is electrically coupled to the integrated circuit and to a particular one of the at least two contacts recessed within the chip-embedded substrate.

Example 8

The method of any one of examples 1-7, further comprising: selecting the chip-embedded substrate from among a plurality of chip-embedded substrates each one that exhibits a distinct embedded circuit architecture, wherein the chip-embedded substrate comprises an integrated circuit, at least two discrete transistors and a plurality of through-via conductors each one that is electrically coupled to the integrated circuit, to a particular one of the at least two contacts recessed within the chip-embedded substrate and to a particular one of the at least two discrete transistors.

Example 9

The method of any one of examples 1-8, machining the input/output pin for each one of the at least two contacts comprises: shaping the input/output pin for each one of the at least two contacts so that an exposed contact surface of a first input/output pin is approximately coplanar with an exposed contact surface of a second input/output pin.

Example 10

The method of any one of examples 1-9, further comprising: mounting the chip-embedded substrate to a printed circuit board wherein the input/output pin for each one of the at least two contacts is coupled to a particular contact pad of the printed circuit board.

Example 11

A semiconductor device package, comprising: a chip-embedded substrate that includes at least two exposed input/output pins each one that exhibits a cross-sectional area distinct from at least one other of the at least two exposed input/output pins and that extends from the chip-embedded substrate to a height that is common for each of the at least two exposed input/output pins within specification tolerance.

Example 12

The semiconductor device package of example 11, wherein a first one of the at least two exposed input/output pins extends from a first contact that is recessed within the chip-embedded substrate and a second one of the at least two exposed input/output pins extends from a second contact that is recessed within the chip-embedded substrate at a depth different than the first contact.

Example 13

The semiconductor device package of any one of examples 11-12, wherein an exposed surface of a first one of the at least two exposed input/output pins is approximately coplanar with an exposed surface of a second one of the at least two exposed input/output pins.

Example 14

The semiconductor device package of any one of examples 11-13, wherein an unexposed surface of each at least one of the at least two exposed input/output pins is in contact with a beveled surface of a dielectric material of the chip-embedded substrate.

Example 15

The semiconductor device package of any one of examples 11-14, wherein the chip-embedded substrate comprises power converter circuitry and each one of the at least two exposed input/output pins is electrically coupled to a node of the power converter circuitry via a corresponding contact that is recessed within the chip-embedded substrate.

Example 16

The semiconductor device package of any one of examples 11-15, wherein the chip-embedded substrate comprises an integrated circuit and a plurality of through-via conductors each one that is electrically coupled to the integrated circuit and to a particular one of the at least two exposed input/output pins via a corresponding contact that is recessed within the chip-embedded substrate.

Example 17

The semiconductor device package of any one of examples 11-16, wherein the chip-embedded substrate comprises an integrated circuit, at least two discrete transistors and a plurality of through-via conductors each one that is electrically coupled to the integrated circuit and to a particular one of the at least two exposed input/output pins and a particular one of at least two discrete transistors via a corresponding contact that is recessed within the chip-embedded substrate.

Example 18

The semiconductor device package of any one of examples 11-17, wherein the at least two exposed input/output pins are each electrically coupled to an integrated circuit embedded within the chip-embedded substrate via a corresponding contact that is recessed within the chip-embedded substrate.

Example 19

The semiconductor device package of any one of examples 11-18, wherein the at least exposed input/output pins are each electrically coupled to an integrated circuit and to a transistor embedded within the chip-embedded substrate via a corresponding contact that is recessed within the chip-embedded substrate.

Example 20

A method comprising: depositing solder to each one of a plurality of differently-sized contacts recessed at different depths within a chip-embedded substrate that comprises power converter circuitry; temperature-cycling the chip-embedded substrate to induce solder reflow and define an input/output pin for each one of the plurality of contacts that is electrically coupled to the power converter circuitry via a corresponding one of the plurality of contacts; and machining the input/output pin for each one of the at least two contacts to extend exposed from the chip-embedded substrate to a common height within specification tolerance.

Various examples of the disclosure have been described. Any combination of the described systems, operations, or functions is contemplated. These and other examples are within the scope of the following claims.

What is claimed is:
1. A semiconductor device package comprising:
a chip-embedded substrate that includes:
at least two exposed input/output pins;
a first contact that is recessed within the chip-embedded substrate; and
a second contact that is recessed within the chip-embedded substrate at a depth different than the first contact,
wherein each one of the at least two exposed input/output pins comprises solder,
wherein each one of the at least two exposed input/output pins exhibits a cross-sectional area distinct from at least one other of the at least two exposed input/output pins,
wherein each one of the at least two exposed input/output pins extends from the chip-embedded substrate to a height that is common for each of the at least two exposed input/output pins within specification tolerance,
wherein the solder of the first one of the at least two exposed input/output pins extends from the first contact to the height that is common within the specification tolerance, and
wherein the solder of the second one of the at least two exposed input/output pins extends from the second contact to the height that is common within the specification tolerance.

2. The semiconductor device package of claim 1, wherein an exposed surface of the first one of the at least two exposed input/output pins is approximately coplanar with an exposed surface of the second one of the at least two exposed input/output pins.

3. The semiconductor device package of claim 1, wherein an unexposed surface of each at least one of the at least two exposed input/output pins is in contact with a beveled surface of a dielectric material of the chip-embedded substrate.

4. The semiconductor device package of claim 1, wherein the chip-embedded substrate comprises power converter circuitry and each one of the at least two exposed input/output pins is electrically coupled to a node of the power converter circuitry via a corresponding contact that is recessed within the chip-embedded substrate.

5. The semiconductor device package of claim 1, wherein the chip-embedded substrate comprises an integrated circuit and a plurality of through-via conductors each one that is electrically coupled to the integrated circuit and to a particular one of the at least two exposed input/output pins via a corresponding contact that is recessed within the chip-embedded substrate.

6. The semiconductor device package of claim 1, wherein the chip-embedded substrate comprises an integrated circuit, at least two discrete transistors and a plurality of through-via conductors each one that is electrically coupled to the integrated circuit and to a particular one of the at least two exposed input/output pins and a particular one of at least two discrete transistors via a corresponding contact that is recessed within the chip-embedded substrate.

7. The semiconductor device package of claim 1, wherein the at least two exposed input/output pins are each electrically coupled to an integrated circuit embedded within the chip-embedded substrate via a corresponding contact that is recessed within the chip-embedded substrate.

8. The semiconductor device package of claim 1, wherein the at least two exposed input/output pins are each electrically coupled to an integrated circuit and to a transistor embedded within the chip-embedded substrate via a corresponding contact that is recessed within the chip-embedded substrate.

9. The semiconductor device package of claim 1, wherein a volume of the solder of the first one of the at least two exposed input/output pins is different than a volume of the solder of the second one of the at least two exposed input/output pins.

10. A chip-embedded substrate comprising:
   at least two contacts recessed at different depths from a particular surface within the chip-embedded substrate, the at least two contacts comprising:
      a first contact recessed at a first depth from the particular surface within the chip-embedded substrate;
      a second contact recessed at a second depth from the particular surface within the chip-embedded substrate, the second depth being different than the first depth; and
   a contact-specific volume of solder positioned within each contact of the at least two contacts,
   wherein the contact-specific volume of solder defines an input/output pin for each contact of the at least two contacts,
   wherein each contact of the at least two contacts extends exposed from the chip-embedded substrate to a common height within specification tolerance, and
   wherein the contact-specific volume of solder comprises:
      a first volume of solder positioned within the first contact, wherein the first volume of solder extends from the first contact at the first depth to the common height; and
      a second volume of solder positioned within the second contact, wherein the second volume of solder extends from the second contact at the second depth to the common height.

11. The chip-embedded substrate of claim 10, further comprising:
   a first input/output pin defined by the first volume of solder, the first input/output pin comprising a first exposed contact surface; and
   a second input/output pin defined by the second volume of solder, the second input/output pin comprising a second exposed contact surface, the second exposed contact surface being approximately coplanar with the first exposed contact surface.

12. The chip-embedded substrate of claim 11,
   wherein the chip-embedded substrate is configured to be mounted to a printed circuit board,
   wherein the first input/output pin is configured to couple to a first contact pad on the printed circuit board, and
   wherein the second input/output pin is configured to couple to a second contact pad on the printed circuit board.

13. The chip-embedded substrate of claim 10, further comprising:
   an integrated circuit; and
   a plurality of through-via conductors, wherein each through-via conductor of the plurality of through-via conductors is electrically coupled to the integrated circuit and electrically coupled to a contact of the at least two contacts recessed within the chip-embedded substrate.

14. The chip-embedded substrate of claim 10, further comprising:
   an integrated circuit;
   at least two discrete transistors; and
   a plurality of through-via conductors, wherein each through-via conductor of the plurality of through-via conductors is electrically coupled to the integrated circuit, electrically coupled to a contact of the at least two contacts recessed within the chip-embedded substrate, and electrically coupled to a discrete transistor of the at least two discrete transistors.

15. The chip-embedded substrate of claim 10, wherein the first volume of solder is different than the second volume of solder.

16. A device comprising:
   a printed circuit board comprising at least two contact pads; and
   a chip-embedded substrate comprising:
      at least two contacts recessed at different depths from a particular surface within the chip-embedded substrate, the particular surface facing the printed circuit board, and the at least two contacts comprising:
         a first contact recessed at a first depth from the particular surface within the chip-embedded substrate;
         a second contact recessed at a second depth from the particular surface within the chip-embedded substrate, the second depth being different than the first depth; and
      at least two input/output pins, wherein each input/output pin of the at least two input/output pins is defined by a contact-specific volume of solder positioned within a contact of the at least two contacts of the chip-embedded substrate,
      wherein the chip-embedded substrate is surface-mounted to the printed circuit board by the input/output pins, and
      wherein the contact-specific volume of solder comprises:
         a first volume of solder positioned within the first contact, wherein the first volume of solder extends from the first contact at the first depth to the common height; and
         a second volume of solder positioned within the second contact, wherein the second volume of solder extends from the second contact at the second depth to the common height.

17. The device of claim 16, wherein the chip-embedded substrate further comprises:
   an integrated circuit; and
   a plurality of through-via conductors, wherein each through-via conductor of the plurality of through-via conductors is electrically coupled to the integrated circuit and electrically coupled to a contact of the at least two contacts recessed within the chip-embedded substrate.

18. The device of claim 16, wherein the chip-embedded substrate further comprises:
   an integrated circuit;
   at least two discrete transistors; and
   a plurality of through-via conductors, wherein each through-via conductor of the plurality of through-via conductors is electrically coupled to the integrated circuit, electrically coupled to a contact of the at least two contacts recessed within the chip-embedded substrate, and electrically coupled to a discrete transistor of the at least two discrete transistors.

19. The device of claim 16,
   wherein the chip-embedded substrate further comprises an integrated circuit embedded within the chip-embedded substrate, and
   wherein each input/output pin of the at least two input/output pins is electrically coupled to the integrated circuit via a corresponding contact of the at least two contacts.

20. The device of claim 16, wherein the first volume of solder is different than the second volume of solder.

\* \* \* \* \*